United States Patent
Ponto et al.

[11] Patent Number: 6,093,887
[45] Date of Patent: Jul. 25, 2000

[54] ARRANGEMENT FOR HIGH-FREQUENCY OPAQUE SHIELDING

[75] Inventors: Robert Ponto, Seligenstadt; Willy Bohnenberger, Mainflingen; Gerd Haxel, Seligenstadt, all of Germany

[73] Assignee: AEG Intermas GmbH, Germany

[21] Appl. No.: 09/165,898

[22] Filed: Oct. 2, 1998

[30] Foreign Application Priority Data

Mar. 22, 1997 [DE] Germany ............................ 197 12 146
Jan. 21, 1998 [DE] Germany ............................ 198 02 162

[51] Int. Cl.$^7$ ....................................................... H05K 9/00
[52] U.S. Cl. ............................................................ 174/35 R
[58] Field of Search ............................ 174/35 R, 35 GC, 174/35 C

[56] References Cited

U.S. PATENT DOCUMENTS

| | | | |
|---|---|---|---|
| 4,572,921 | 2/1986 | May et al. .......................... | 174/35 GC |
| 4,803,306 | 2/1989 | Malmquist .......................... | 174/35 GC |
| 4,879,434 | 11/1989 | Assel et al. ............................ | 174/35 R |
| 5,029,254 | 7/1991 | Stickney ............................... | 174/35 GC |
| 5,313,016 | 5/1994 | Brusati et al. ....................... | 174/35 GC |

FOREIGN PATENT DOCUMENTS

| | | |
|---|---|---|
| 0401418 | 12/1990 | European Pat. Off. . |
| 3604860 | 8/1987 | Germany . |
| 4114484 | 11/1992 | Germany . |
| 19544835 | 12/1995 | Germany . |

*Primary Examiner*—Dean A. Reichard
*Assistant Examiner*—W. David Walkenhorst
*Attorney, Agent, or Firm*—Bierman, Muserlian and Lucas

[57] ABSTRACT

The invention relates to an arrangement for high-frequency opaque shielding of walls, or portions thereof, of a housing, wherein the walls or their portions include a plate-form basic element (12) having a shielding function, with, if appropriate, wall prongs (16) projecting from these into the housing, and wherein in at least one side margin region (14) extending perpendicularly to the front face (18) of the basic element, extend a first groove (20) with sidewall (24, 26) disposed in the proximity of or remote from the front face as well as a groove bottom (28) into which a first prong (42), U-form in section, of a spring element (40) can be emplaced which with a further prong (48) extends in regions along the side margin region. Independently of whether or not the basic element is a sheet panel or a profiled panel with wall prongs, it is suggested that, in order to secure a spring element in the first groove (20) extending in the side margin region (14) the first prong (42), U-form in section, of the spring element (40) can be snapped in.

18 Claims, 3 Drawing Sheets

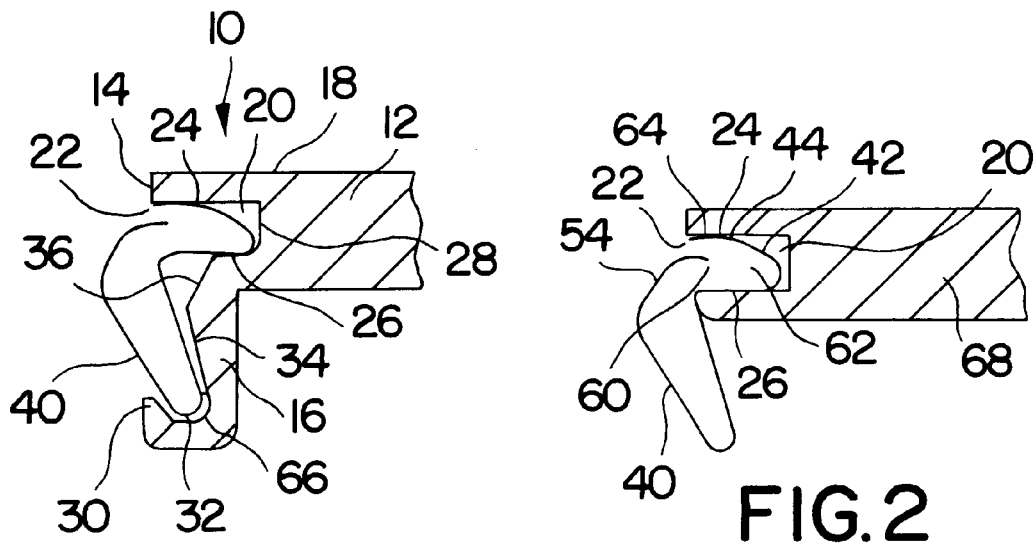
FIG. 1
FIG. 2
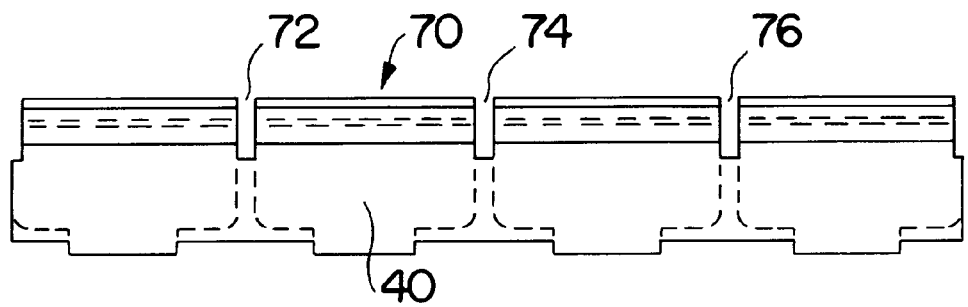
FIG. 3
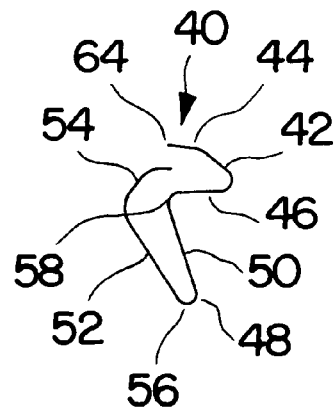
FIG. 4

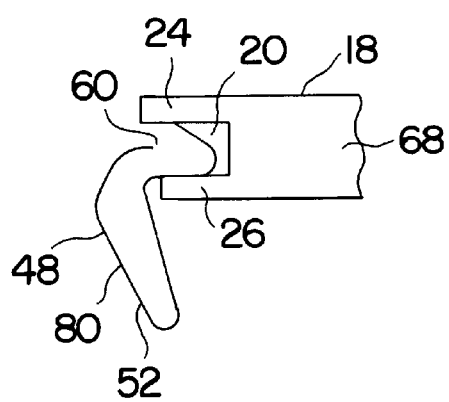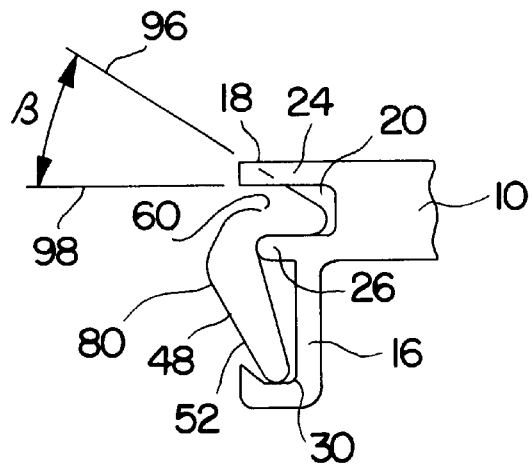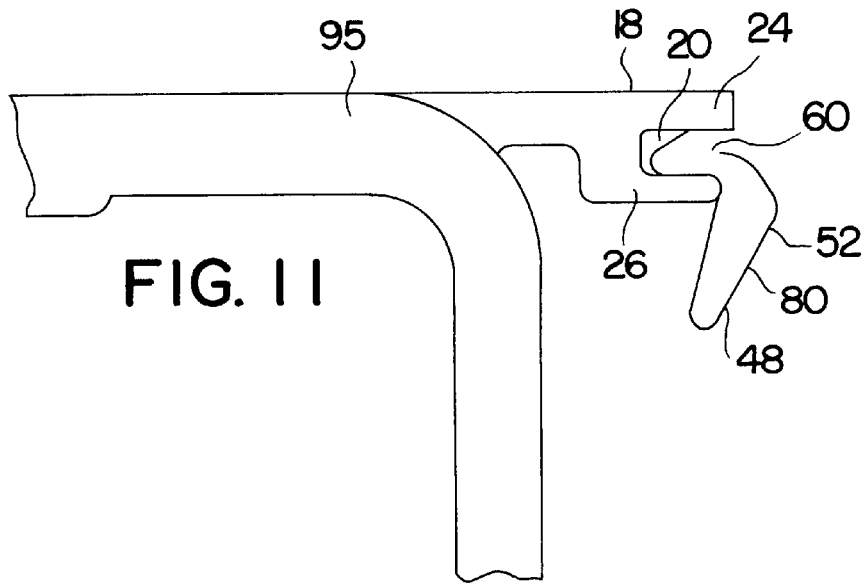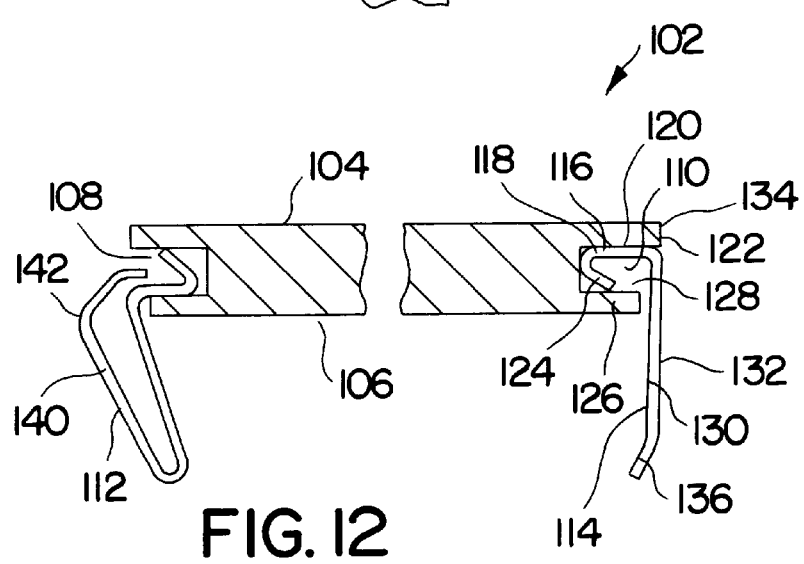

ARRANGEMENT FOR HIGH-FREQUENCY OPAQUE SHIELDING

BACKGROUND OF THE INVENTION

The invention relates to an arrangement for the high-frequency opaque shielding of the walls, or portions thereof, of a housing and, in particular, to the front panels of a subrack. The walls, or portions thereof, each comprise a plate-form basic element comprising a shielding function with wall prongs, if appropriate, projecting from it into the housing. In at least a side margin region, and extending perpendicularly from the front face of the basic element, a first receptor, such as a groove, is positioned. The groove has two side walls situated proximate to or remote from the front face and a bottom (groove bottom). Into the groove extends a first prong, which is U-form in cross-section, of a spring element. A further prong of the spring element extends along the side margin region.

Subracks for shielding the interior space from external electromagnetic fields and the region outside of the subrack against electromagnetic fields generated in the interior of the components are known. Leaf springs having a so-called spring leg and positioned between panels, extending from the front panel and reaching into the housing interior, are positioned in the groove The outwardly arched spring leg of the leaf spring can come into conducting contact with a rack-and-panel connector of an adjacent front panel to ensure the required high-frequency opacity (DE 3604860 C2).

EP 401418 B1 teaches a shielding device for an electrical component in which a contact sheet developed as a screening sheet covers the entire front panel and is directly contactable with the screening sheets of the adjacent front panels.

In an arrangement of this type, a spring element engages a groove extending along a narrow side of the panel by means of a clamping portion. A spring leaf having a base portion and a contact portion extends from the clamping portion at right angles. The contact portion is bent back onto itself and bears a contact lip which contacts a corresponding contact portion of an adjacent structural element (DE 19544835 C1).

Such spring elements have a complex geometry and are costly to manufacture. The base portion must extend in a plane along the narrow side since it would otherwise be impossible to line up several panels at the requisite close spacing. In order for the spring element to say in the groove, the clamping portion must be a spring claw. However, this does not always ensure that the spring element will stay securely in the groove.

SUMMARY OF THE INVENTION

The present invention addresses the problem of further developing an arrangement as described above that has a sufficient shielding function, a simple geometry and is reliably securable in the groove without requiring a complex geometry. It should also be possible to insert the spring equally readily into both sheet front panels and profile front panels. The spring should not hinder the sliding in or pulling out of adjacent components, nor should it catch adjacent circuit boards. It should also be possible to fabricate the receptor for the spring element, developed as a groove, in a single operating process, for example by machining.

DESCRIPTION OF THE INVENTION

According to the invention the task is solved in that the first prong of the spring element, which is U-form in cross-section, has in its front transverse peripheral region at least one segment which is braced into, or essentially into, a side wall of the first receptor and extends in a plane defined by the outer prong segment and in proximity to the front face of the first receptor. The further prong of the spring element is a second U-form prong which comprises a peripheral segment bent in the direction of the first U-form prong. The invention further provides that the front transverse peripheral region of the first U-form prong has a V-form profile.

According to a further embodiment, the front transverse peripheral region of the first prong has at least one projection, such as a point, as the segment. A roof-form cut-out can also be provided in the front transverse peripheral region of the first prong.

Since the first segment of the spring element, which extends within the receptor, is braced with its point-like segment or projection on the side wall disposed in the proximity of the front face, a wedging action takes place such that the spring element is secured to prevent unchecked detachment. Consequently, a spring element of simple geometry can be used and can be placed in the receptor without any problem.

In the case of a first U-form prong placed in the first receptor, the front free prong segment should preferably extend in a plane which intersects the side wall of the front panel at an angle $\beta$ wherein $60° \geq \beta \geq 30°$, and preferably $\beta = 45°$. Accordingly, the dimensions of the width of the receptor must be selected relative to the outer prong segment of the first U-form prong.

In particular with the spring element released, the free end of the peripheral segment of the outer prong segment of the second U-form prong should extend in, or approximately in, a plane which is defined by the transition region between the first and second U-form prongs and the front transverse peripheral region of the first U-form prong.

When installed, the spring element should extend within the perpendicular projection of the side wall, in proximity to the front panel, of the first receptor. If appropriate, even the peripheral segment of the second U-form prong, which is bent in the direction of the first U-form prong, can extend with its free end into the space encompassed by the first U-form prong.

In an alternative embodiment, the side wall of the first receptor, in the proximity of the front face and extending in the side margin region of the basic element, has a projection. The U-form first prong of the spring element extends with its free end between the projection and the bottom of the receptor. The further prong of the spring element is a second U-form prong which comprises a peripheral segment bent in the direction of the first prong and extends preferably within the space encompassed by the first U-form prong. The extension between the two prong segments thus forms a "V."

The spring element comprises two U-form prongs, one changing over into the other, to form an acute angle with the free end of the outer prong segment of the second U-form prong being able to extend between the prong segments of the first U-form prong. Thus, with the first U-form placed in the receptor, the free end of the second U-form prong does not hinder sliding in or pulling out of adjacent basic elements, or catch subracks extending from them.

Since the outer prong segment of the first U-form prong of the spring element is secured through the projection extending from the front face-side wall of the receptor, there is no unchecked sliding of the spring element out of the receptor, provided that the spacing of the side prong segments of the first U-form prong in the released state of the spring element is greater than the spacing of the walls of the first receptor.

In a further teaching according to the invention, it is provided that the spacing between the peripheral segment of the outer prong segment of the second U-form prong, which extends in the direction of the first U-form prong, and the apex region of the second U-form prong is approximately equal to the spacing between the apex region and the transition between the inner prong segments of the first and second U-form prongs. This yields an advantageous spring characteristic, i.e. the spring element can have a desired soft spring characteristic, whereby the sliding in and pulling out of adjacent basic elements is not hindered.

The length of the first U-form prong is less than that of the second U-form prong. The lengths preferably have a ratio of 1:1.5 to 1:3, and more preferably approximately 1:2.

An intrinsically inventive further development is that the apex region of the second U-form prong proceeds into a second receptor of a wall prong, extending into the housing, of the basic element. Through the wall prong, a reinforcement of the basic element takes place. The wall prong simultaneously offers a protection against sliding of the spring element. Consequently, robust handling is possible.

Independently thereof, the spring element developed according to the invention can equally well be used in basic elements which are developed as sheet front panels or as profile front panels.

If the apex region of the first U-form prong and the apex region of the second U-form prong extend in a receptor, their center axes should describe an acute angle with respect to one another.

Furthermore, it is provided that the sidewall, in proximity to the front face, of the first groove (receptor) has a greater depth than the sidewall remote from the front face. This offers the capability of developing the projection, such as a nose, which extends from the sidewall proximate to the front face by working the inner surface of the side wall. The development of the nose takes place in particular in extruded parts. If these are formed by machining, the projection is usefully omitted.

In the event that front panels are lined up one to another, shielding can take place through abutting spring elements of the previously described type. Alternatively, it is feasible that from a longitudinal margin a wall prong, rather than a spring element, projects extending into the interior of the housing in the form of a contact prong, which cooperates with a spring element of a succeeding front panel.

However, if the spring elements are braced against each for shielding, the contact takes place in the form of a line on the apex points of the spring ends. As soon as these ends are not exactly flush, in the presence of strong spring forces and/or low intrinsic rigidity of the front panel, these may become deflected. In order to make this impossible, an intrinsically inventive further development of the invention provides that a front panel in the particular longitudinal margin comprises a longitudinal groove and a spring element, in particular of the previously described type. In the other, a contact element engages with a first prong, U-form in cross-section, which can be snapped into the longitudinal groove. A further contact prong, extending outside of the front panel, extends perpendicularly, or nearly perpendicularly, to the front face of the front panel.

When the front panels are lined up, the second prong of the previously described spring elements is in contact with these second contact prongs, with a line-form contact taking place.

Since the further prong of the spring element extends so as to be arched in the direction of the other spring element, a line-form contact between the prongs occurs such that the outwardly bent prong can slide to the degree necessary along the other prong. In this way, the effective forces can be introduced into the other spring element such that a warping of the front panel is not possible.

Preferably, the line-form contact takes place directly in the region of a plane which is formed approximately from the rear faces of the front panels or extends, offset to it, outside of the front panels. The spring element and the contact element thus cooperate in a region in which the contact element has sufficient rigidity with respect to its outer prong that the required contact between the springs occurs, and thus the desired shielding is ensured.

BRIEF DESCRIPTION OF THE DRAWINGS

Further details, advantages and characteristics of the invention may be understood by the following description of preferred embodiment examples depicted in the drawings wherein:

FIG. 1 is a detail of a first embodiment of a profiled front panel with emplaced spring element, in section;

FIG. 2 is a detail of a first embodiment of a sheet front panel with emplaced spring element, in section;

FIG. 3 shows a series of contiguous spring elements of a first embodiment;

FIG. 4 is a cross-section of a spring element according to FIG. 3;

FIG. 9 is an embodiment of a flat front panel in detail;

FIG. 10 is a further embodiment of a profiled front panel;

FIG. 11 shows in detail a flange profile of a side wall of a subrack; and

FIG. 12 is a further embodiment of a front panel with a first spring element or contact element emplaced in the longitudinal grooves.

DETAILED DESCRIPTION OF THE DRAWINGS

Figure 5:
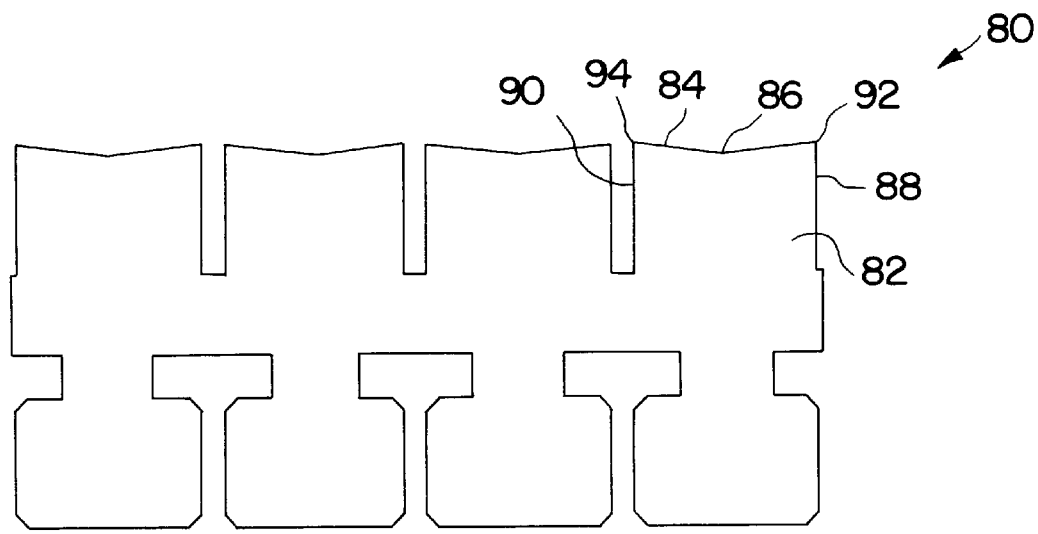
FIG. 5 is a cutting of a second embodiment of attached spring elements.

Housings which are intended for high-frequency technology must be realized with high-frequency opacity. It must be ensured that the electromagnetic radiation generated by the components disposed in the housing does not penetrate to the outside, and that electromagnetic radiation cannot penetrate into the housing. This means that points between housing walls or front panels must be developed such that they are high-frequency opaque. A corresponding sealing, formed by means of leaf springs, will be explained in conjunction with FIGS. 1–11 wherein the leaf springs are used to seal off front panels with respect to each other or with respect to the housing walls. However, this is not intended to restrict the teaching according to the invention; rather, application of this invention is possible wherever joints are to be sealed against electromagnetic radiation.

FIGS. 1–4 and 5–11 show various embodiments of housing segments or front panels and spring elements shielding these against one another.

For example, FIG. 1 depicts a detail of a profiled front panel 10. This comprises a basic element denoted as front panel 12 with a wall prong 16 extending from its one longitudinal margin 14 and, when installed, projecting into the interior of a device. From the opposing longitudinal margin of the front panel 12, a corresponding wall prong 16 or a contact prong can extend which is in contact, so as to be electrically conducting, with a spring element of an adjacent front panel.

Extending parallel to the front face 18 of the front panel 12, and starting from its longitudinal margin 14, is a first groove 20. Extending from longitudinal margin 14 is a nose-like projection 22. This extends over the entire length of the front face-side wall 24 of groove 20. The depth of the boundary wall 26, remote from the front face 18 of groove 20, is less than that of the opposing wall 24. The walls 24, 26 change over into one another via a groove bottom 28.

In wall prong 16 is a further groove 30 whose outside wall 32 is developed V-form in section and is considerably shorter than the inside wall 34. Wall 34, via an obliquity 36 extending at an obtuse angle with respect to wall 34, changes over into wall 26. Into the first and second grooves 20, 30, which form receptors, a leaf spring element 40 is set. Spring element 40, shown in section, has the form of a sickle and encompasses a first U-form prong 42 with outer prong segment 44 and inner prong segment 46. A second U-form prong 48, extending from the first U-form prong 42, has an inner prong segment 50 and an outer prong segment 52. A further inner prong segments 46 and 50 change over into one another and describe an acute angle, preferably of approximately 50–70°, and more preferably of approximately 60°.

The first U-form prong 42 is of lesser length than the second U-form prong 48. The prong lengths preferably have a ratio to each other of from 1:1.5 to 1:3, in particular 1:2.

The outer prong segment 52 of the second U-form prong 48 comprises a peripheral segment 54 bent in the direction of the first U-form prong 42. The peripheral segment 54 is bent in the direction of the first U-form prong 42 and is spaced from the apex region 56 a distance which is approximately equal to the length of the spacing between the apex region 56 and the transition region 58.

The free end 60 of the peripheral segment 54 is bent in the direction of the first prong 42 and extends into the space 62 formed between the inner and outer prong segments 46, 44 of the first U-form prong 42. Consequently, the free end 60 is overlapped by the free end 64 of the outer prong segment 44 of the first U-form prong 42.

After the spring element 40 is snapped into the first and second grooves 20, 30, the free end 64 is retained by projection 22, which carries out the function of a securement. This ensures that the spring element 40 cannot slide unchecked out of the first groove 20 and, consequently, the spring element 40 is secured.

The second U-form prong 48 is received with its apex region 56 by the second groove 30 and, thus, protected against sliding. If appropriate, between groove bottom 66 of the second groove 30 and prong 48 a spacing can be disposed in its apex region.

However, even if the second U-form prong 48 does not extend in a groove 30, the spring element 40 is secured to a sufficient degree by the first groove 20.

The spring element 40, developed according to the invention, can also be set into a sheet front panel 68 as shown in FIG. 2. Thus, the outer prong segment 44 is retained in groove 20 either by intrinsic prestress and snapping-in or through nose 22, provided that the first U-form prong 42 has a width in the region of the front edge which is greater than that of groove 20.

The spring element 40 has a kidney or sickle form in section which is opened so that outer prong segment 44 can abut the projection 22 of the front-side wall 24 of groove 20 and, thus, can secure the spring element 40.

Spring element 40 is produced in one piece by punching it out from a sheet strip 70. The sheet strip 70 is divided through cut-outs 72, 74, 76 into segments which, in section, have a geometry which corresponds to that of the spring element 40 shown in FIGS. 1, 2 and 4. Thus, a leaf spring is made available which extends over the entire length of groove 20 or grooves 20, 30 and, for example, over the entire height of the inner volume of a housing which is to be shielded.

Figure 6:
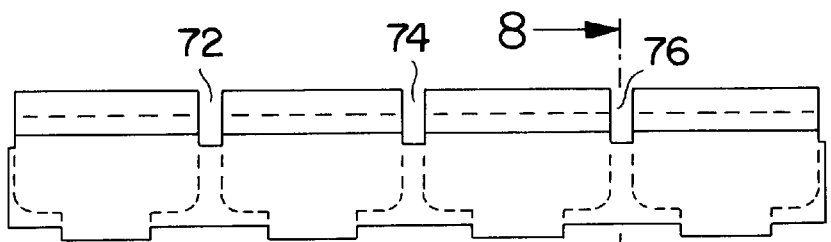
FIG. 6 is a front view of the spring elements bent from the cutting of FIG. 5.

In FIGS. 5–11, elements corresponding to elements of FIGS. 1 and 4 share identical reference symbols. The spring elements 80 in FIGS. 5–11 are also segments of a cutting of a sheet metal strip which, as a comparison of FIGS. 5 and 6 shows, have the desired geometry by bending. Consequently, the spring elements 80 form segments of a leaf spring which are separated to a sufficient degree by cut-outs 72, 74, 76.

The individual spring elements 80 have an open kidney or banana form corresponding to spring element 40, with the first U-form prong 42. However, the outer transverse peripheral region 84 of the outer prong segment 82 has a "V" or roof-form cut-out 86, or a functionally equivalently acting geometry. Consequently, from the particular longitudinal edge 88, 90 of prong segment 82, a segment such as point-like projection 92 or 94 is developed which proceeds in the plane stretching from the outer prong segment 82.

Because of the shape of the outer transverse peripheral region 84 of the prong segment 82, when spring 80 is placed in the first groove 20 of the profiled front panel 10 or of the sheet front panel 68 or of a sidewall closure profile 94, a wedging or snapping-in takes place. In this way, the spring element 80 is secured to the required degree without the projection 22 shown in FIGS. 1 and 2 being necessary in the front-face side wall 24 of groove 20.

Hooking of the transverse peripheral region 84, due to the hook- or point-like projections 92, 94, takes place to the degree necessary if the angle β defined by the plane 98 and the plane 96 (plane 96 is the angle of the outer prong segment 82 of the first U-form prong 42 of the spring element 80 where it intersects the inner face of the side wall 24), is in particular $60° \geq β \geq 20°$, and more particularly $45° \geq β \geq 30°$.

Figures 7, 8:
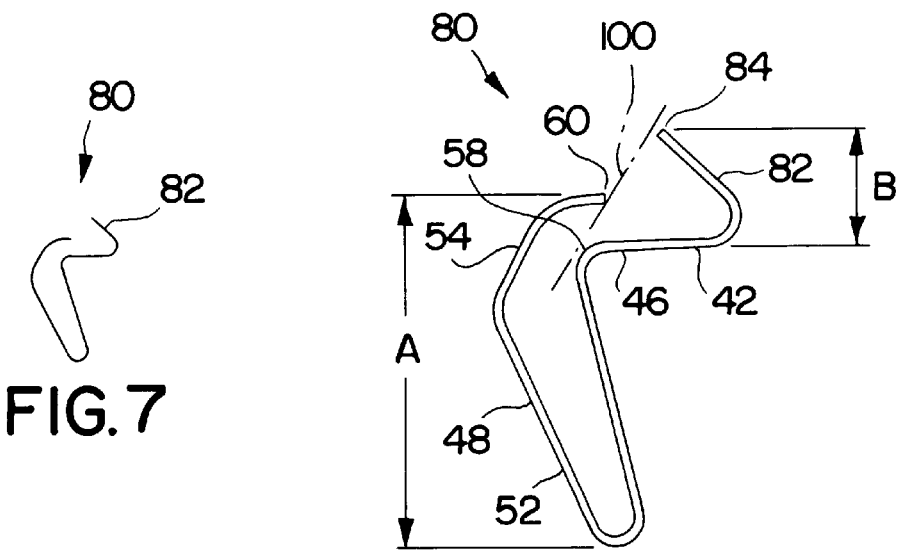
FIG. 7 is a side view of the bent spring elements.
FIG. 8 is an enlarged cross-section of the spring shown along line AB of FIG. 6.

The sectional representation of FIG. 8 shows further characteristics of spring element 80 to be emphasized. In the released state of spring element 80, the free end 60 of the peripheral segment 54 of the second U-form prong 48 extends in, or nearly in, a plane 100 defined by the transverse peripheral region 84 of the first U-form prong 42 and the transition region 58 between first and second U-form prongs 42, 48.

When the spring element 80 is emplaced in groove 20 using the foregoing dimensions, the free end 60 of the outer prong segment 52 does not have to extend into the space encompassed by the first U-form prong 42 but extends solely within the perpendicular projection of side wall 24 of groove 20. This ensures that when sliding in or pulling out adjacent front panels or subracks, a hindering or a catching on the spring element 80 does not occur. If the plane stretching from the inner prong segment 46 of the first U-form prong 42 is taken as the reference face, the second U-form prong 48 has, in a projection extending parallel to the reference face, a height A whose ratio A:B to the corresponding projection B of the first U-form prong 42 is approximately 3:1.

The ratio of the length of the inner prong segment 46 of the first U-form prong 42 to the length of the prong segment 82, comprising the outer, V-form coursing, transverse peripheral region 84, should be approximately 1.35:1.

The same advantage is obtained for the spring element 80 according to FIGS. 5–11 as for the construction of FIGS. 1–4.

The drawings further show that the free end 60 of the second U-form prong 48, both in the released state and in the installed state of spring element 80, extends in the direction of the first U-form prong 42, offset such that the transition region 58 extends between the first and second U-form prong 42, 48 and below the projection of the outer prong segment 82 when viewed in a direction perpendicular to the reference plane taken along inner prong segment 46.

FIG. 12 shows in detail a further embodiment of a front panel 102 which comprises a front face 104, a rear face 106, as well as longitudinal grooves 108, 110. The grooves 108, 110 have a formation corresponding to the groove 20 according to FIG. 2. To this extent, reference is made to the respective disclosure.

Into the first groove 108 a first spring element 112 is loaded which can correspond to spring element 80 in structure. Into the second groove 110 a contact element 114 is loaded. Contact element 114 comprises a first U- or V-form prong 116 which extends into groove 110 and has resilient properties.

Prong 116 extends with an inner segment 118 along inner wall 120, extending at the front side of the front-side wall 122 of groove 110, and is preferably in planar contact with it.

Outer segment 124 of prong 116 is supported on the rear-side wall 126 of groove 110, i.e. its inner wall 128. The rear-side wall 126 of groove 110, according to the embodiment of FIG. 2, is shorter than the front-side wall 122.

Extending from the first prong 116 is a second, non-resilient prong 130 which extends perpendicularly, or nearly perpendicularly, to segment 118 of the first prong 116, and which is in planar support on the inner wall 120 of side wall 122. Prong 130 has outer face 132 which is perpendicular to the front face 104 of the front panel 102 and extends in a plane with the front-side wall 122 and its longitudinal margin 134. In other words, the longitudinal margin 134 is flush, or nearly flush, with the outer face 132 of the contact element 114. The free end 136 of the second prong 130 is bent inwardly at an angle.

If the front panel 102 is lined up with another corresponding front panel, he required electrically conducting connection between spring elements 112 and 114 is made and the desired electromagnetic shielding is ensured because the prong 130 of contact element 114 contacts spring element 112 and its second prong 140 bent outwardly. Contact is made via its projecting region 142, also referred to as a round-end. The prong 140 of spring element 112 is supported with its outwardly bent round-end in line form on prong 130 of the spring element 114, in a region which extends in or outside of the plane which includes the rear face 106 of the front panel 102.

The round-end 142 is supported on the smooth, outer face 132 of the second prong 130 of spring element 114 irrespective of existing frictional forces. The sliding of the round-end 142 along the outer face 132 when the front panels are lined up results in no forces being transmitted, and there is no danger of warping of the front panels.

We claim:

1. Arrangement for high-frequency opaque shielding of walls of a housing wherein the walls comprise a plate-form basic element (12) having a shielding function, with wall prongs (16) projecting, if appropriate, into the housing, and wherein at least one side margin region (14) extending perpendicularly to a front face (18) of the basic element has a first receptor (20), with a sidewall (24, 26) in the proximity of the front face or disposed remote from it, and a bottom (28) into which a first prong (42), U-form in section, of a spring element (80) can be emplaced, said spring element having a further prong (48) in regions along the at least one side margin region, characterized in that the first prong (42), U-form in section, of spring element (80) comprises a front transverse peripheral region (84) having a V-form or roof-form course and at least one projection forming a point (92, 94) extending in or substantially in a plane defined by an outer prong segment (82) of said first prong and supported on the side wall (24), disposed in the proximity of the front face (18) of the first receptor (20), and that the further prong of the spring element is a second U-form prong (48) which comprises a peripheral segment (54) bent in the direction of the first U-form prong.

2. Arrangement as claimed in claim 1, characterized in that with the first U-form prong (42) emplaced in the first receptor (20) its outer prong segment (82) extends in a plane (96) which intersects the sidewall (24) disposed in the proximity of the front face at an angle β of preferably $60° \geq \beta \geq 20°$, in particular $45° \geq \beta \geq 30°$.

3. Arrangement as claimed in claim 1, characterized in that with the spring element (80) released, a free outer transverse edge (60) of the second U-form prong (48) extends in or approximately in a plane which is defined by a transition region (58) between the first and the second U-form prongs and a transverse peripheral region (84) of the first U-form prong (42).

4. Arrangement as claimed in claim 1, characterized in that the peripheral segment (54), bent in the direction of the first U-form prong (42), of the second U-form prong (48) extends with a free edge (60) in the region of perpendicular projection of sidewall (24) bounding the first receptor (20) at the front face.

5. Arrangement as claimed in claim 1, characterized in that from the sidewall (24), disposed in the proximity of the front face (18) of the basic element (12), of the receptor (20) extending in the side margin region (14) a projection (22) extends, that the first prong (42), U-form in section, of the spring element (80) extends with its free end (64) between the projection and the bottom (28), and that the further prong of the spring element is a second U-form prong (48) which comprises a peripheral segment (54) bent in the direction of the first U-form prong.

6. Arrangement as claimed in claim 1, characterized in that the peripheral segment (54), bent in the direction of the first U-form prong (42), of the second U-form prong (48) extends with its free edge (60) within the space (62) encompassed by the first U-form prong.

7. Arrangement as claimed in claim 1, characterized in that the first and the second U-form prongs (42, 48) form an acute angle with respect to their inner prong segments (46, 50) of which one changes over into the other.

8. Arrangement as claimed in claim 7, characterized in that the inner prong segments (46, 50), of which one changes over into the other, of the first and second U-form prongs (42, 48) form an angle of approximately 50° to 70°, preferably approximately 60°.

9. Arrangement as claimed in claim 1, characterized in that the length of the first U-form prong (42) is less than that of the second U-form prongs (48), with the ratio of the lengths of the prong being approximately 1:1.4 to 1:3.0, in particular approximately 1:2.

10. Arrangement as claimed in claim 1, characterized in that the peripheral segment (54) of the outer prong segment (52) of the second U-form prong (48) is bent at a spacing from its apex region (56) in the direction of the first U-form prong (42), which is approximately equal to the spacing between the apex point and transition between the inner prong segments (46, 50) from the first and second U-form prongs (42, 48).

11. Arrangement as claimed in claim 1, characterized in that an apex region (56) of the second U-form prong (48) extends in a second receptor (30) of a wall prong (16), extending into the housing.

12. Arrangement as claimed in claim 11, characterized in that the first and second grooves (20, 30) or their center axes form an acute angle which corresponds approximately to the angle which is formed by the first and second U-form prongs (42, 48) with their center axes.

13. Arrangement as claimed in claim 1, characterized in that the sidewall (26), disposed remote from the front face (18), of the first receptor (20) has a lesser depth than the sidewall (24) disposed in the proximity of the front face.

14. Arrangement as claimed in claim 1, characterized in that the basic element (12, 94) is a sheet front panel or a portion of a profile front panel, preferably U- or L-form in section, or a segment of a sidewall closure profile (95).

15. Arrangement for the high-frequency opaque shielding of walls of a housing wherein the walls comprise a plate-form basic element having a shielding function, wherein in one side margin region extending perpendicularly from a front face (104) there is a first longitudinal groove (108) and in another side margin region extending perpendicularly from the front face (104) there is a second longitudinal groove (110), each groove (108, 110) having a sidewall (122, 126), disposed in the proximity of or remote from the front face, as well as a groove bottom, and wherein into the first longitudinal groove a first prong, U-form in section, of a first spring element (112) can be emplaced, which extends with a further prong (14) in regions along the one side margin region, the first prong, U-form in section, of the first spring element in its front transverse peripheral region (84) comprising at least one segment extending in or substantially in a plane generated by an outer prong segment, and supported on the side wall, disposed in the proximity of the front face, of the first longitudinal groove, and the further prong of the first spring element being a second U-form prong (140) which comprises a peripheral segment, bent in the direction of the first U-form prong, and wherein into the second longitudinal groove (110) can be emplaced a first prong (116), U-form in section, of a contact element (114) whose further prong (13) extends perpendicularly or nearly perpendicularly to the front face (140) such that when two basic elements are lined up, the further prong of the first spring element of one of the basic elements is in contact with the further prong of the contact element of the other basic element and said prongs form a line.

16. Arrangement as claimed in claim 15, characterized in that the contact between the first spring element (112) and the contact element (114) extends to rear-side faces (106) of the basic elements.

17. Arrangement as claimed in claim 15, characterized in that the further prong (130) of the contact element (114) extends with its outside face (132) outside of a plane defined by a longitudinal margin (134) of the side wall (122) of the second longitudinal groove (110).

18. Arrangement as claimed in claim 17, characterized in that the further prong (130) of the contact element (114) has substantially no resilient properties.

* * * * *